(12) United States Patent
Onozawa

(10) Patent No.: US 9,941,395 B2
(45) Date of Patent: Apr. 10, 2018

(54) INSULATED GATE SEMICONDUCTOR DEVICE AND METHOD FOR MANUFACTURING THE SAME

(71) Applicant: FUJI ELECTRIC CO., LTD., Kawasaki-shi (JP)

(72) Inventor: Yuichi Onozawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/249,074

(22) Filed: Apr. 9, 2014

(65) Prior Publication Data

US 2014/0231865 A1    Aug. 21, 2014

Related U.S. Application Data

(63) Continuation of application No. PCT/JP2012/079675, filed on Nov. 15, 2012.

(30) Foreign Application Priority Data

Nov. 28, 2011 (JP) ................................. 2011-258819

(51) Int. Cl.
*H01L 29/66* (2006.01)
*H01L 29/739* (2006.01)
(Continued)

(52) U.S. Cl.
CPC ........ *H01L 29/7397* (2013.01); *H01L 29/063* (2013.01); *H01L 29/1095* (2013.01);
(Continued)

(58) Field of Classification Search
CPC ............. H01L 29/739; H01L 29/66348; H01L 29/063; H01L 29/7397; H01L 29/1095;
(Continued)

(56) References Cited

U.S. PATENT DOCUMENTS 5,329,142 A    7/1994 Kitagawa et al.
5,923,066 A *  7/1999 Tihanyi ............... H01L 29/1095
                                                    257/139

(Continued)

FOREIGN PATENT DOCUMENTS

DE    102006024504 A1    11/2007
EP        1032047 A2      8/2000
(Continued)

OTHER PUBLICATIONS

European Search Report issued in European counterpart application No. EP12853082.1, dated Jul. 2, 2015.

(Continued)

*Primary Examiner* — Anthony Ho
*Assistant Examiner* — Mohammad M Hoque
(74) *Attorney, Agent, or Firm* — Rossi, Kimms & McDowell LLP

(57) ABSTRACT

An insulated gate semiconductor device includes a region that is provided between trenches in which a gate electrode is filled through a gate insulating film in a surface layer of a substrate, includes a p base region and an n+ emitter region, and comes into conductive contact with an emitter electrode and a p-type floating region that is electrically insulated by an insulating film which is interposed between the p-type floating region and the emitter electrode. The p-type floating region is deeper than the trench and has a lower impurity concentration than the p base region.

14 Claims, 5 Drawing Sheets

(51) Int. Cl.
*H01L 29/06* (2006.01)
*H01L 29/10* (2006.01)
*H01L 29/40* (2006.01)

(52) U.S. Cl.
CPC .... *H01L 29/66348* (2013.01); *H01L 29/0615* (2013.01); *H01L 29/0619* (2013.01); *H01L 29/402* (2013.01)

(58) Field of Classification Search
CPC .............. H01L 29/0619; H01L 29/0615; H01L 29/402
USPC ............................ 257/139; 438/138
See application file for complete search history.

(56) References Cited

U.S. PATENT DOCUMENTS

| | | | |
|---|---|---|---|
| 6,445,048 B1 * | 9/2002 | Pfirsch | H01L 21/763 257/329 |
| 2001/0054738 A1 | 12/2001 | Momota et al. | |
| 2004/0084722 A1 | 5/2004 | Yamaguchi et al. | |
| 2005/0263852 A1 * | 12/2005 | Ogura | H01L 29/0834 257/565 |
| 2007/0272978 A1 | 11/2007 | Mauder et al. | |
| 2008/0246055 A1 * | 10/2008 | Schulze | H01L 29/16 257/133 |
| 2009/0057713 A1 * | 3/2009 | Hirler | H01L 29/1095 257/143 |
| 2009/0200559 A1 | 8/2009 | Suzuki et al. | |
| 2010/0078756 A1 | 4/2010 | Schmidt | |
| 2010/0096692 A1 * | 4/2010 | Saito | H01L 29/0634 257/330 |
| 2010/0156506 A1 * | 6/2010 | Tsuzuki | H01L 27/0664 327/478 |
| 2011/0018029 A1 * | 1/2011 | Pfirsch | H01L 29/0696 257/147 |
| 2011/0042714 A1 * | 2/2011 | Ogura | 257/139 |
| 2011/0233684 A1 * | 9/2011 | Matsushita | H01L 29/1095 257/378 |

FOREIGN PATENT DOCUMENTS

| | | | |
|---|---|---|---|
| JP | 05-243561 A | | 9/1993 |
| JP | 2001-308327 A | | 11/2001 |
| JP | 2002-184987 A | | 6/2002 |
| JP | 2002184987 | * | 6/2002 |
| JP | 2004-039838 A | | 2/2004 |
| JP | 2004039838 A | * | 2/2004 |
| JP | 2004-153112 A | | 5/2004 |
| JP | 2005294649 A | | 10/2005 |
| JP | 2005-340626 A | | 12/2005 |
| JP | 2007-317683 A | | 12/2007 |
| JP | 2007-324539 A | | 12/2007 |
| JP | 2007317683 | * | 12/2007 |
| JP | 2009-043782 A | | 2/2009 |
| JP | 2010-098123 A | | 4/2010 |
| JP | 2010-147222 A | | 7/2010 |
| JP | 2010147222 | * | 7/2010 |
| JP | 2011-055017 A | | 3/2011 |
| JP | 2011-204803 A | | 10/2011 |

OTHER PUBLICATIONS

International Search Report issued in International Application No. PCT/JP2012/079675 dated Feb. 19, 2013. English translation provided.

Written Opinion issued in International Application No. PCT/JP2012/079675 dated Feb. 19, 2013. English ranslation provided.

\* cited by examiner

INSULATED GATE SEMICONDUCTOR DEVICE AND METHOD FOR MANUFACTURING THE SAME

BACKGROUND OF THE INVENTION

A. Field of the Invention

The present invention relates to a semiconductor device used in, for example, a power conversion apparatus, and more particularly, to an insulated gate semiconductor device (IGBT) and a method for manufacturing the same.

B. Description of the Related Art

A technique for reducing the power consumption of a power conversion apparatus has been developed and there are great expectations for a power device capable of reducing the power consumption of the power conversion apparatus. Among the power devices, an insulated gate bipolar transistor (hereinafter, referred to as an IGBT) which obtains a low on-voltage using a conductivity modulation effect and easily controls a gate using a voltage has been generally used.

In a trench gate IGBT in which a trench with a small width is vertically formed from the surface of a silicon wafer and a gate electrode is provided in the trench with an oxide film interposed therebetween, channels are formed on both side surfaces of the trench. Therefore, it is possible to increase the density of channels and reduce an on-voltage, as compared to a so-called planar IGBT in which a gate electrode is formed on the surface of a silicon wafer. In recent years, the field of application of the trench gate IGBT has been expanded.

Next, the structure of the trench gate IGBT will be described. FIG. 4 is a cross-sectional view illustrating a main part of a general IGBT including a trench gate. FIG. 4 illustrates the cross section of a silicon wafer when an n-channel trench gate IGBT in which a gate electrode is provided in a trench with a stripe-shaped planar pattern (not illustrated) with a gate insulating film interposed therebetween is cut in a direction in which the trench gate is traversed in a plan view.

The trench gate IGBT illustrated in the cross-sectional view of FIG. 4 includes a p-type silicon substrate 1a with high concentration. An n-type silicon wafer, which is an n⁻ drift layer 2 with low concentration, is provided on the surface of silicon substrate 1a. P base region 3 is formed on the surface of the silicon wafer. N⁺ emitter region 4 is selectively formed in the surface of p base region 3.

Trench 10 is formed so as to extend from the surface of n⁺ emitter region 4 to n⁻ drift layer 2 through p base region 3. Gate insulating film 5 is provided on the inner surface of trench 10. Gate electrode 6 is filled inside gate insulating film 5. Gate electrode 6 is made of conductive polycrystalline silicon. In FIG. 4, gate electrode 6 is hatched. Gate insulating film 5 is interposed between the inner surface of trench 10 and gate electrode 6.

Interlayer insulating film 7 is formed so as to cover the upper part of gate electrode 6. Emitter electrode 8 is provided on the upper part of interlayer insulating film 7. Emitter electrode 8 has a sheet shape and is provided so as to contact both n⁺ emitter region 4 and p base region 3. Emitter electrode 8 is provided so as to cover p base region 3, the surface of n⁺ emitter region 4, and interlayer insulating film 7. In some cases, a nitride film or an amorphous silicon film is formed as a passivation film on emitter electrode 8. However, FIG. 4 does not illustrate the passivation film. In addition, a collector electrode 9 is provided on a surface (hereinafter, referred to as a rear surface) of p-type silicon substrate 1a opposite to n⁻ drift layer 2.

Next, the operation of the IGBT will be described. However, p-type region 11 which is a surface layer region of the silicon substrate interposed between trenches 10 and is covered with emitter electrode 8 with insulating film (interlayer insulating film 7) interposed therebetween will be described below. First, an operation of changing the trench gate IGBT from an off state to an on state will be described.

The IGBT is turned off when emitter electrode 8 is generally connected to the ground, a voltage higher than emitter electrode 8 is applied to the collector electrode 9 (a forward voltage is applied), and a voltage applied to the gate is lower than a threshold value. When a gate driving circuit (not illustrated) applies a voltage higher than the threshold value to gate electrode 6 through a gate resistor, charge starts to be stored in gate electrode 6.

At the same time as charge is stored in gate electrode 6, a portion of p base region 3 which faces gate electrode 6 with gate insulating film 5 interposed therebetween is inverted into an n type to form a channel region (not illustrated). In this way, an electronic current is injected from the emitter electrode 8 to n⁻ drift layer 2 through n⁺ emitter region 4 and n-channel region of p base region 3.

The junction between p-type silicon substrate 1a and n⁻ drift layer 2 is forward biased by the injected electron and holes are injected from collector electrode 9. Then, the IGBT is turned on. In the IGBT which is in the on state, a voltage drop between emitter electrode 8 and collector electrode 9 is an on-voltage. At that time, the conductivity of n⁻ drift layer 2 is modulated by the injection of the holes. Therefore, the IGBT has a low on-voltage, as compared to a MOSFET which has the same structure as the IGBT except that holes are not injected.

The voltage between emitter electrode 8 and the gate electrode 6 is set to be lower than a threshold value in order to change the IGBT from the on state to the off state. Then, the charge stored in gate electrode 6 is discharged to a gate driving circuit through a gate resistor. At that time, the n channel region which has been inverted into the n type returns to the p type and the n-channel region is removed. Therefore, no electron is supplied and no hole is injected. The electrons and holes stored in n⁻ drift layer 2 are discharged (emitted) to collector electrode 9 and emitter electrode 8, respectively, or are recombined with each other. As a result, a current is reduced and the IGBT is turned off.

Various improvement methods have been proposed in order to further reduce the on-voltage of the trench gate IGBT. For example, an injection enhanced gate bipolar transistor (IEGT) disclosed in the following JP 5-243561 A (FIG. 101) has limitation characteristics close to the on-voltage of a diode.

In the IEGT, the surfaces of an n⁺ emitter region and a p base region are partially covered with an insulating layer and the covered region does not contact an emitter electrode. The basic operation of the IEGT is the same as that of the trench gate IGBT. Holes below the p base region in a portion of the IEGT in which the n⁺ emitter region and the p base region do not contact the emitter electrode are less likely to be emitted to the emitter electrode. Therefore, the holes are stored in the portion.

As a result, since the carrier concentration distribution of the n⁻ drift layer is close to the concentration distribution of the diode, the on-voltage of the IEGT can be lower than that of the general trench gate IGBT. However, the power device requires high-speed switching characteristics, in addition to the low on-voltage and it is also important to improve the high-speed switching characteristics.

In the trench gate IGBT and the IEGT, the trench gate has a high-density structure in order to reduce the on-voltage. Therefore, the capacitance between the gate electrode and the emitter electrode increases. As described in the operation of the IGBT, when the IGBT changes to an on operation and an off operation, the capacitance between the gate electrode and the emitter electrode needs to be charged and discharged. However, when the capacitance between the gate electrode and the emitter electrode is large, the charge and discharge time increases and loss caused by the increase of the charge and discharge time in the charge and discharge time increases.

The loss of the power device is the sum of steady loss determined by the on-voltage and switching loss generated during the on operation and the off operation. Therefore, it is also important to reduce the switching loss. In order to reduce the switching loss, it is also necessary to reduce the capacitance between the gate electrode and the emitter electrode causing the switching loss.

Next, the structure of an IGBT disclosed in the following JP 2001-308327 A (FIG. 1) will be described again with reference to FIG. 4. In the IGBT, p-type region 11 is covered with insulating layer 7 so as not to contact emitter electrode 8, which makes it difficult for holes to be emitted to an emitter electrode. As a result, holes are stored in the vicinity of p-type region 11 and the carrier concentration distribution of n⁻ drift layer 2 is close to that of the diode. In addition, since p-type region 11 is covered with insulating layer 7, the function of trench gate 10 does not operate effectively. As a result, the capacitance between gate electrode 6 and emitter electrode 8 is reduced and the charge and discharge time is shortened. Therefore, switching loss is reduced.

However, the structure of the IGBT (FIG. 4) disclosed in JP 2001-308327, that is, the structure including p-type region 11 which is interposed between the trenches, is insulated from emitter electrode 8, and is in the floating state in terms of potential has the essential problem that it is difficult to obtain a high breakdown voltage. The reason is as follows. Since the trenches are not arranged at regular intervals and p-type floating region 11 is provided between the trenches, the distribution of the electric field when the IGBT is turned off is not uniform, as compared to the structure in which p-type floating region 11 is not provided between the trenches, the electric field is likely to be concentrated on the bottom of the trench gate, and the breakdown voltage is likely to be reduced.

As means for solving these problems, a method has been known which forms p-type region 11 which is in a floating state in terms of potential to be deeper than trench 10, reduces the concentration of the electric field on the bottom of trench 10, and obtains a high breakdown voltage. However, in this method, since p-type region 11 which is in a floating state in terms of potential is formed deep, the effective thickness of n⁻ drift layer 2 is reduced and the electric field strength in the vertical direction increases. Therefore, the breakdown voltage is likely to be reduced and it is difficult to sufficiently improve the breakdown voltage.

The present invention is directed to overcoming or at least reducing the effects of one or more of the problems set forth above.

SUMMARY OF THE INVENTION

The invention has been made in view of the problems and provides an insulated gate semiconductor device that includes a diffusion layer which is deeper than a trench gate and is in a floating state in terms of potential and has a low on-voltage and a high breakdown voltage characteristic.

In order to solve the problems, an insulated gate semiconductor device according to the invention includes a first-conduction-type drift layer that is a semiconductor substrate, a second-conduction-type base region that is selectively formed on one main surface of the first-conduction-type drift layer, a first-conduction-type emitter region that is selectively formed in a surface of the second-conduction-type base region, a second-conduction-type semiconductor layer that is formed on the other main surface of the first-conduction-type drift layer, a plurality of trenches that have a depth greater than that of the second-conduction-type base region from the surface of the first-conduction-type emitter region and has a parallel-stripe-shaped planar pattern along a longitudinal direction of the first-conduction-type emitter region, and a gate electrode that is filled in each of the plurality of trenches with an insulating film interposed therebetween. A plurality of surface regions interposed between the plurality of trenches include second-conduction-type floating regions that are electrically insulated and are alternately arranged, together with the second-conduction-type base region and the first-conduction-type emitter region which come into conductive contact with an emitter electrode. The second-conduction-type floating region is deeper than the trench and has a lower impurity concentration than the second-conduction-type base region.

In the insulated gate semiconductor device according to the invention, the impurity concentration of the second-conduction-type floating region may be so low that a depletion layer which is spread from a junction of the second-conduction-type floating region by the application of a rated voltage when power is turned off can be spread to a position where the level of the depletion layer is equal to at least that of the bottom of the second-conduction-type base region.

The insulated gate semiconductor device according to the invention may further include a field stop region that is provided in a portion of the second-conduction-type floating region which comes into contact with the trench and has a higher impurity concentration than the second-conduction-type floating region.

In the insulated gate semiconductor device according to the invention, the thickness of the insulating film in the trench which comes into contact with the second-conduction-type floating region may be greater than the thickness of a gate insulating film in the trench which comes into contact with the second-conduction-type base region.

In the insulated gate semiconductor device according to the above-mentioned aspect of the invention, the insulated gate semiconductor device may be a trench gate IGBT.

According to the invention, there is provided a method for manufacturing an insulated gate semiconductor device which includes a first-conduction-type drift layer that is a semiconductor substrate, a second-conduction-type base region that is selectively formed on one main surface of the first-conduction-type drift layer, a first-conduction-type emitter region that is selectively formed in a surface of the second-conduction-type base region, a second-conduction-type semiconductor layer that is formed on the other main surface of the first-conduction-type drift layer, a plurality of trenches that have a depth greater than that of the second-conduction-type base region from the surface of the first-conduction-type emitter region and have a parallel-stripe-shaped planar pattern along a longitudinal direction of the first-conduction-type emitter region, and a gate electrode that is filled in each of the plurality of trenches with an insulating film interposed therebetween and in which a plurality of surface regions interposed between the plurality of trenches include second-conduction-type floating regions that are electrically insulated and are alternately arranged, together with the second-conduction-type base region and the first-conduction-type emitter region which come into conductive contact with an emitter electrode, and the second-conduction-type floating region is deeper than the trench and has a lower impurity concentration than the second-conduction-type base region. The method includes forming the second-conduction-type floating region at the same time as a guard ring which is provided in a breakdown voltage structure region surrounding the outermost circumference of the second-conduction-type floating region in order to relax an electric field is formed.

According to the invention, there is provided a method for manufacturing an insulated gate semiconductor device which includes a first-conduction-type drift layer that is a semiconductor substrate, a second-conduction-type base region that is selectively formed on one main surface of the first-conduction-type drift layer, a first-conduction-type emitter region that is selectively formed in a surface of the second-conduction-type base region, a second-conduction-type semiconductor layer that is formed on the other main surface of the first-conduction-type drift layer, a plurality of trenches that have a depth greater than that of the second-conduction-type base region from the surface of the first-conduction-type emitter region and have a parallel-stripe-shaped planar pattern along a longitudinal direction of the first-conduction-type emitter region, and a gate electrode that is filled in each of the plurality of trenches with an insulating film interposed therebetween and in which a plurality of surface regions interposed between the plurality of trenches include second-conduction-type floating regions that are electrically insulated and are alternately arranged, together with the second-conduction-type base region and the first-conduction-type emitter region which come into conductive contact with an emitter electrode, and the second-conduction-type floating region is deeper than the trench and has a lower impurity concentration than the second-conduction-type base region. The method includes forming the second-conduction-type floating region at the same time as a second-conduction-type RESURF region which is provided in a breakdown voltage structure region surrounding the outermost circumference of the second-conduction-type floating region in order to relax an electric field is formed.

According to the invention, it is possible to provide an insulated gate semiconductor device that includes a diffusion layer which is deeper than a trench gate and is in a floating state in terms of potential and can obtain a low on-voltage and a high breakdown voltage characteristic.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
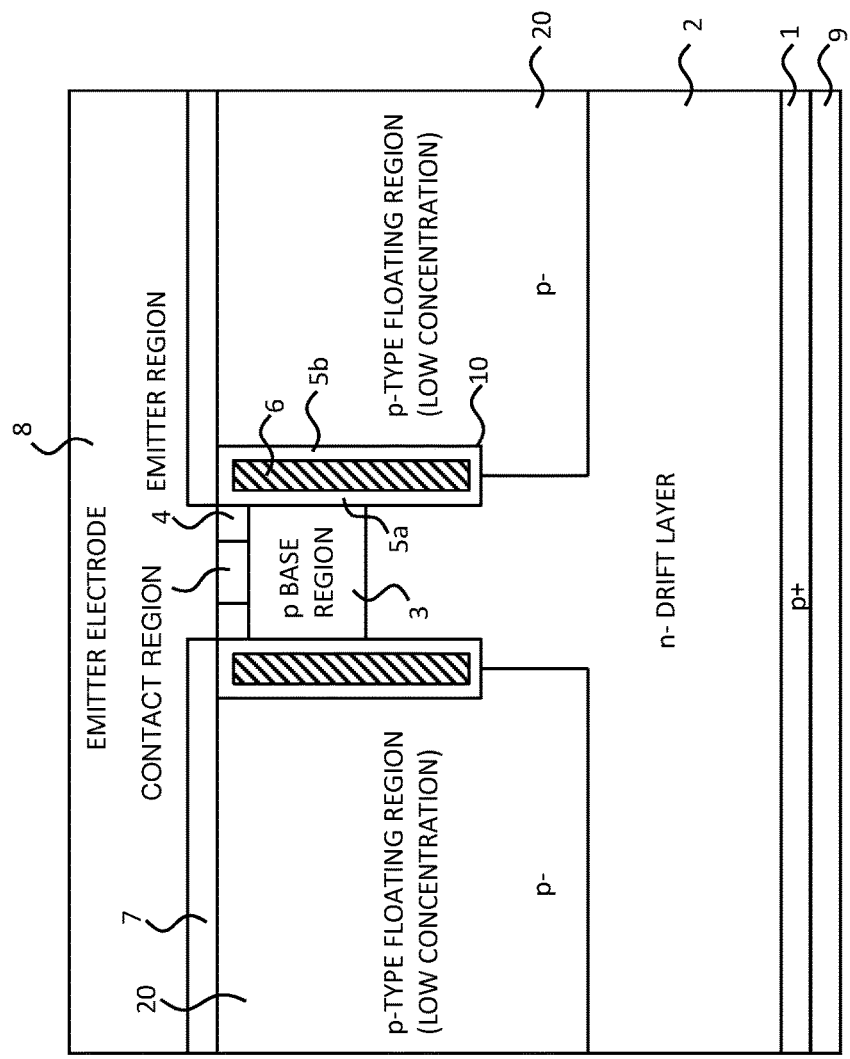
FIG. 1 is a cross-sectional view illustrating a main part of a trench gate of an IGBT according to Embodiment 1 of the invention.

Hereinafter, an insulated gate semiconductor device and a method for manufacturing the same according to embodiments of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher or lower than that of the layer without the symbols. In the description of the following embodiments and the accompanying drawings, the same components are denoted by the same reference numerals and the description thereof will not be repeated. In addition, the invention is not limited to the following embodiments as long as it does not depart from the scope and spirit thereof.

Embodiment 1

Figure 5:
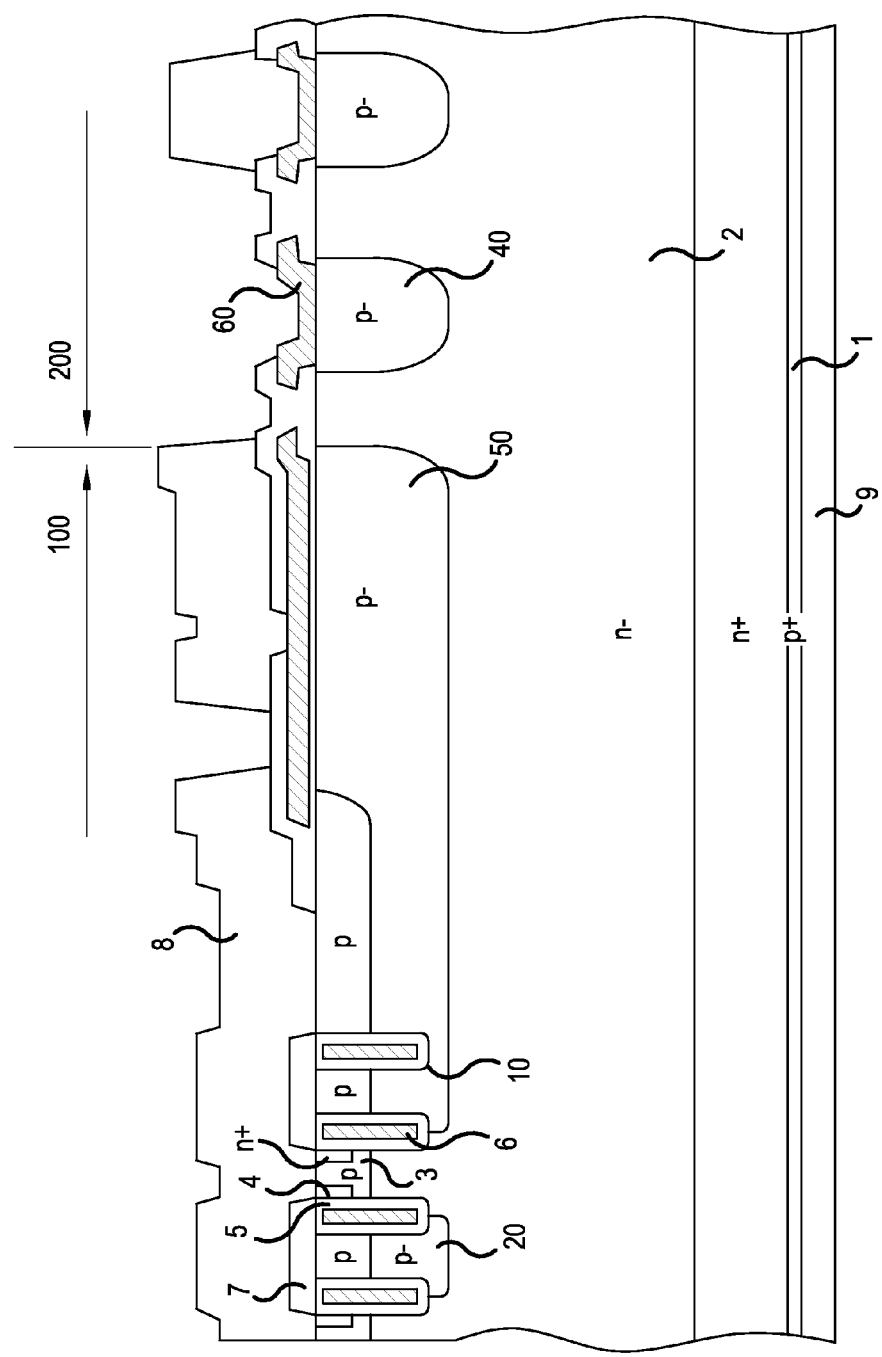
FIG. 5 is a cross-sectional view illustrating a main part of an element active portion and a breakdown voltage structure portion of the IGBT according to Embodiment 1 of the invention.

FIG. 1 is a cross-sectional view illustrating a main part of a trench gate of an IGBT according to Embodiment 1 of the invention. FIG. 5 is a cross-sectional view illustrating a main part of an element active portion and a breakdown voltage structure portion of the IGBT according to Embodiment 1 of the invention. FIGS. 1 and 5 are cross-sectional views illustrating a main part of an IGBT as an insulated gate semiconductor device according to Embodiment 1 of the invention.

As illustrated in FIG. 1, the IGBT according to the invention includes a plurality of trenches 10 which are vertically formed in a surface of a silicon semiconductor substrate and have a parallel-stripe-shaped planar pattern. A gate electrode 6 which is made of conductive polysilicon is filled in each of the plurality of trenches 10, with a gate insulating film 5a interposed therebetween. In this way, a trench gate structure is formed.

A portion including p base region 3 and n⁺ emitter region 4 that is selectively provided in a surface layer of p base region 3 and a portion including p-type floating region 20 that is in a floating state in terms of potential are provided in the surface layer of the silicon substrate interposed between trenches 10. In the planar pattern, the portion including n⁺ emitter region 4 and the portion including p-type floating region 20 are alternately provided on the surface of the semiconductor substrate.

Figure 2:
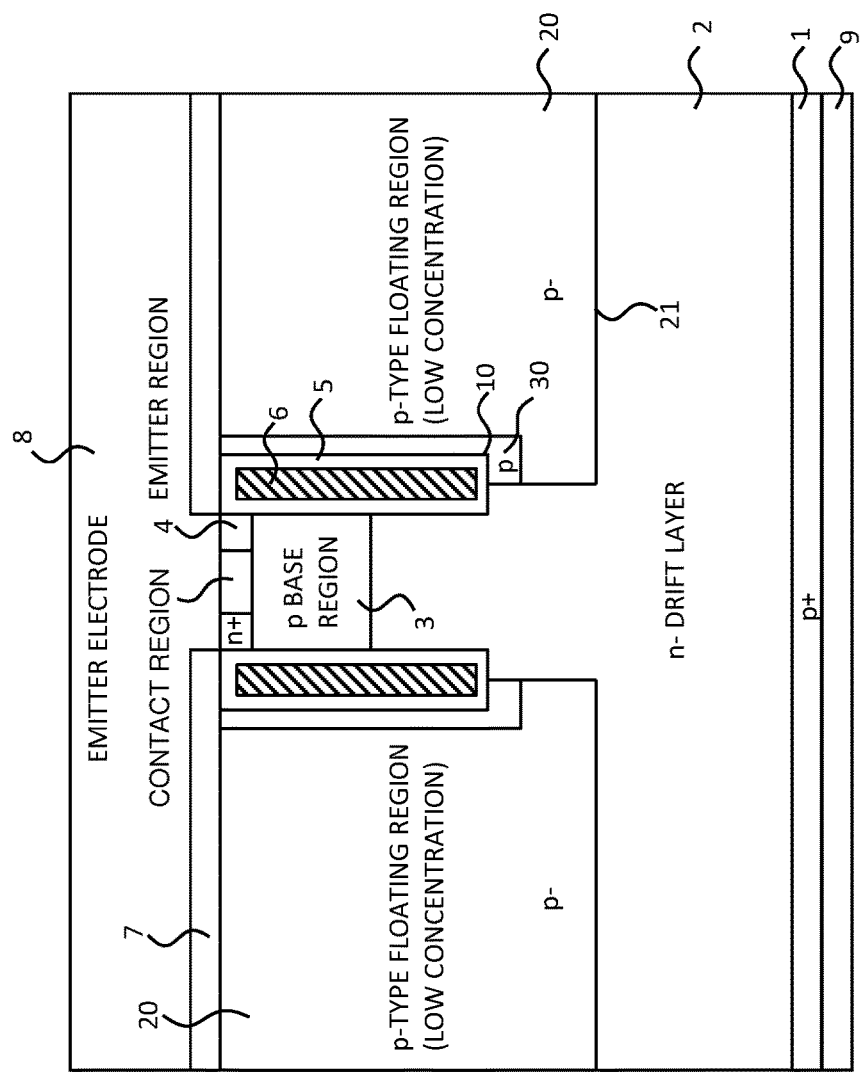
FIG. 2 is a cross-sectional view illustrating a main part of a trench gate of an IGBT according to Embodiment 2 of the invention.

A shallow p contact region (denoted as "CONTACT REGION" in FIGS. 1-3) with high impurity concentration is provided in the surface of p base region 3 in order to improve an ohmic contact. In addition, p-type floating region 20 is characterized in that it has a lower concentration than p base region 3 and is diffused below trench 10, and is different from that in the structure of the trench gate IGBT according to the related art illustrated in FIG. 4.

Figure 4:
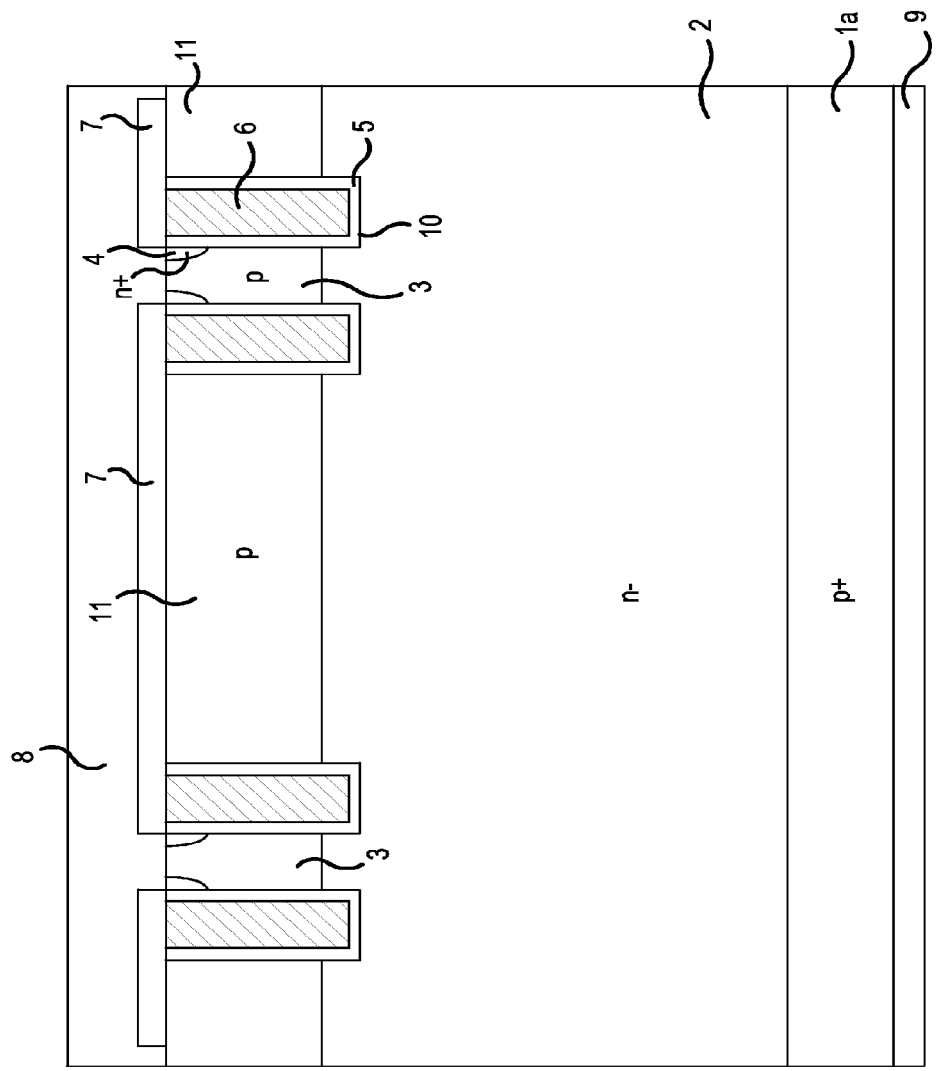
FIG. 4 is a cross-sectional view illustrating a main part of a general IGBT including a trench gate.

The other structures may be the same as those in the trench gate IGBT according to the related art illustrated in FIG. 4. The entire surface of p-type floating region 20 is covered with insulating film 7 such that p-type floating region 20 is electrically insulated from an emitter electrode. Therefore, even when a gate voltage equal to or greater than a threshold value is applied to gate electrodes 6 of two trench gates provided both sides of p-type floating region 20 and an inversion layer is formed in a portion of p-type floating region 20 facing the gate electrode, no electron is implanted from the emitter electrode, similarly to the IGBT illustrated in FIG. 4.

As described above, the trench gate IGBT including p-type floating region 11 according to the related art illustrated in FIG. 4 has the problem that the breakdown voltage is likely to be reduced, as compared to the general trench gate IGBT without including p-type floating region 11. That is, in the trench gate IGBT including p-type floating region 11 according to the related art illustrated in FIG. 4, the trenches are not arranged at regular intervals and a p-type region which is in a floating state in terms of potential is provided between the trenches. Therefore, the electric field is likely to be concentrated on the bottom of the trench. As a result, the breakdown voltage is likely to be reduced.

In contrast, as described above, in the trench gate IGBT according to Embodiment 1 of the invention illustrated in FIG. 1, p-type floating region 20 has a lower concentration than p base region 3 and is deeper than trench 10. Therefore, when an off-voltage is applied, a depletion layer is likely to be spread into p-type floating region 20. As a result, the electric field strength of the bottom of the trench is reduced and the trench gate IGBT according to the invention has a higher breakdown voltage than the IGBT illustrated in FIG. 4.

The impurity concentration of p-type floating region 20 which is lower than that of p base region 3 is so low that the level of the depletion layer which is spread into p-type floating region 20 by the application of the off-voltage of at least a rated breakdown voltage can be equal to or deeper than the bottom of p base region 3 (the depth from the front surface). Specifically, when the impurity dose of p base region 3 is $1\times10^{13}$ cm$^{-2}$ to $1\times10^{14}$ cm$^{-2}$, it is preferable that the impurity dose of p-type floating region 20 be in the range of $2\times10^{12}$ cm$^{-2}$ to $1\times10^{13}$ cm$^{-2}$.

As illustrated in FIG. 5, p-type floating region 20 is formed at the same time as RESURF region 50 and p guard ring 40 that is provided in breakdown voltage structure portion 200 surrounding the outer circumference of element active portion 100 through which a main current flows in order to relax the electric field are formed. Therefore, the number of photomask steps does not increase and manufacturing costs do not increase. In FIG. 5, a hatched region denoted by reference numeral 60 is a field plate for relaxing the electric field and can be formed by, for example, the same conductive polysilicon film as gate electrode 6.

Next, for the manufacturing process and structure of the trench gate IGBT according to Embodiment 1, a process of forming p-type floating region 20, which is a characteristic portion of the invention, will be mainly described with reference to FIG. 5. When the breakdown voltage is in the range of 600 V to 1200 V, an insulating film is formed as a mask on the (100) plane of an FZ-n semiconductor substrate with a resistivity of about 30 Ωcm 60 Ωcm. Then, boron ions are implanted with a dose of $2\times10^{12}$ cm$^{-2}$ to $1\times10^{13}$ cm$^{-2}$ using the formed insulating film as a mask in order to selectively form the p-type floating region.

After the entire surface of the p-type floating region is covered with the insulating film, vertical trench 10 with a width of 1 μm to 3 μm and a depth of about 5 μm is formed in a stripe-shaped planar pattern between the ion-implanted p-type floating regions by, for example. Anisotropic RIE etching. Then, p-type floating region 20 with a depth of about 7 μm to 8 μm is formed by diffusion drive at a high temperature of about 1250° C. Then, in order to form gate electrode 6 in trench 10 with gate insulating film 5 interposed therebetween, a silicon substrate is thermally diffused and a polysilicon film is accumulated and fills the inside of trench 10.

P base region 3 is formed in the surface layer of the substrate between trenches 10, using the polysilicon film as a mask. P base region 3 is formed with a depth of 2 μm to 4 μm by the implantation of boron ions with a dose of $1\times10^{13}$ cm$^{-2}$ to $1\times10^{14}$ cm$^{-2}$ and by drive thermal diffusion at a temperature of 1150° C. In this case, p base region 3 has a depth of, for example, 3 μm.

Ions are implanted into the surface of p base region 3 using a common insulating film which covers the surface of p-type floating region 20 as a mask, thereby selectively forming n$^+$ emitter region 4 which comes into contact with the side wall of trench 10. It is preferable that n$^+$ emitter region 4 be formed by the implantation of arsenic ions. Then, common emitter electrode 8 which comes into contact with the surfaces of n$^+$ emitter region 4 and p base region 3 is formed by sputtering and a passivation film is formed on emitter electrode 8. In this way, the process for the front surface of the semiconductor substrate ends.

After the process for the front surface of the semiconductor substrate ends, the rear surface of the semiconductor substrate is polished to a desired thickness by, for example, chemical mechanical polishing (CMP). After the polishing process, necessary surface processing is performed. Then, p$^+$ collector layer 1 is formed by the implantation of boron ions and collector electrode 9 is formed thereon. Then, the semiconductor substrate is divided into individual IGBT chips by a dicing process.

According to the trench gate IGBT according to Embodiment 2, field stop region 30 can prevent a depletion layer which is spread from junction 21 of p-type floating region 20 from reaching the trench gate. As a result, it is possible to prevent a reduction in breakdown voltage due to the breakdown of the insulating film which is caused by an increase in the electric field strength of the bottom of the trench gate, which makes it easy to obtain a higher breakdown voltage than the trench gate IGBT according to Embodiment 1.

Field stop region 30, which is a characteristic portion of the IGBT according to Embodiment 2, can be formed as follows: trench 10 is formed by, for example, anisotropic etching; and a semiconductor substrate is inclined and boron ions are obliquely implanted into the semiconductor substrate before gate insulating film 5 is formed. In the oblique ion implantation, the dose needs be equal to or more than $1\times10^{13}$ cm$^{-2}$ which is more than that of the p-type floating region and is equal to that of the p base region.

Embodiment 3

Figure 3:
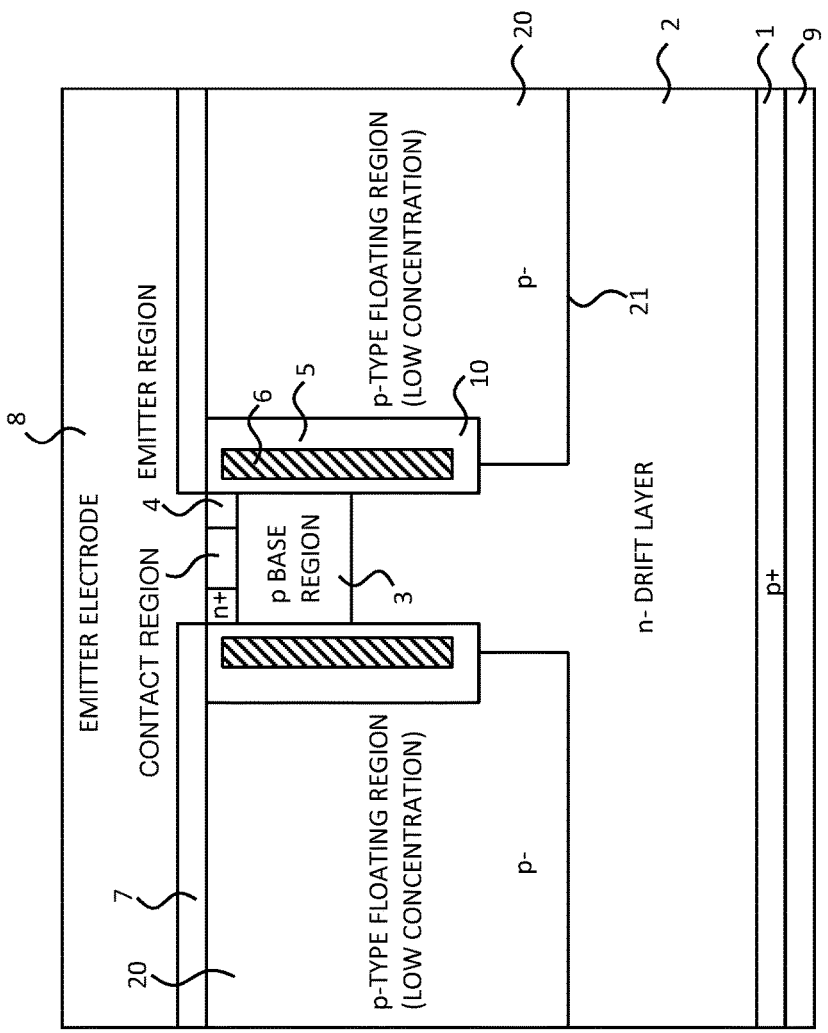
FIG. 3 is a cross-sectional view illustrating a main part of a trench gate of an IGBT according to Embodiment 3 of the invention.

FIG. 3 is a cross-sectional view illustrating a main part of a trench gate of an IGBT according to Embodiment 3 of the invention. FIG. 3 is a cross-sectional view illustrating a main part of a trench gate IGBT according to Embodiment 3 which is an example of the insulated gate semiconductor device according to the invention. The trench gate IGBT according to Embodiment 3 differs from the trench gate IGBTs according to Embodiment 1 and Embodiment 2 in that, in order to prevent an increase in electric field strength at the bottom of a trench gate, an in-trench insulating film is formed with a large thickness (for example, a thickness of 0.5 µm to 1 µm) in a boundary region of p-type floating region 20 with a trench 10, except for gate insulating film 5 among the insulating films provided in the trench so that the dielectric breakdown level is increased, thereby preventing an increase in the breakdown voltage at the bottom of the trench gate.

According to the trench gate IGBT according to Embodiment 3, the thick insulating film can prevent a depletion layer which is spread from junction 21 of p-type floating region 20 from reaching the trench gate. As a result, it is possible to prevent a reduction in breakdown voltage due to the breakdown of the insulating film which is caused by an increase in the electric field strength of the bottom of the trench gate, which makes it easy to obtain a higher breakdown voltage than the trench gate IGBT according to Embodiment 1.

As described above, according to the trench gate IGBTs according to Embodiments 1, 2, and 3, the impurity concentration of the p-type floating region is reduced such that it is easy for the depletion layer to be spread, and the diffusion depth of the p-type floating region is deeper than the depth of the trench to relax a high electric field which is likely to be generated at the bottom of the trench. Therefore, an insulated gate semiconductor device with a low on-voltage and a high breakdown voltage characteristic is obtained. In addition, the p-type floating region is formed at the same time as the RESURF region or the guard ring provided in the breakdown voltage structure is formed. Therefore, it is possible to achieve a manufacturing method without an increase in the number of manufacturing processes and prevent an increase in manufacturing costs.

Thus, an insulated gate semiconductor device (IGBT) and a method for manufacturing the same have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

EXPLANATIONS OF LETTERS OF NUMERALS

1 p+ collector layer, second-conduction-type semiconductor layer
2 n− drift layer, first-conduction-type drift layer
3 p base region, second-conduction-type base region
4 n+ emitter region, first-conduction-type emitter region
5*a* gate insulating film
5*b* insulating film
6 gate electrode
7 insulating film, interlayer insulating film
8 emitter electrode
9 collector electrode
10 trench
11 p-type floating region
20 p-type floating region
21 junction
30 field stop region
40 p-type guard ring
50 RESURF region
60 field plate
100 element active portion
200 breakdown voltage structure portion

What is claimed is:
1. An insulated gate semiconductor device comprising:
a first-conduction-type drift layer that is a semiconductor substrate;
a second-conduction-type base region that is selectively formed on one main surface of the first-conduction-type drift layer;
a second-conduction-type contact region provided in a surface of the second-conduction-type base region to improve an ohmic contact with an emitter electrode;
a first-conduction-type emitter region that is selectively formed in a surface of the second-conduction-type base region;
a second-conduction-type semiconductor layer that is formed on the other main surface of the first-conduction-type drift layer;
a plurality of trenches that have a depth greater than that of the second-conduction-type base region from the surface of the first-conduction-type emitter region and have a parallel-stripe-shaped planar pattern along a longitudinal direction of the first-conduction-type emitter region; and
a gate electrode that is filled in each of the plurality of trenches with an insulating film interposed therebetween,
wherein a plurality of surface regions interposed between the plurality of trenches include a second-conduction-type floating region, the second-conduction-type base region, and the first-conduction-type emitter region;
wherein the second-conduction-type floating region is electrically insulated from the emitter electrode;
wherein the second-conduction-type floating region is alternately arranged with the second-conduction-type base region and the first-conduction-type emitter region;
wherein the second-conduction-type base region and the first-conduction-type emitter region come into conductive contact with the emitter electrode; and
wherein the second-conduction-type floating region is deeper than the trench and has a lower impurity concentration than the second-conduction-type base region.
2. The insulated gate semiconductor device according to claim 1, wherein the impurity concentration of the second-conduction-type floating region is so low that a depletion layer which is spread from a junction of the second-conduction-type floating region by the application of a rated voltage when power is turned off can be spread to a position where the level of the depletion layer is equal to at least that of the bottom of the second-conduction-type base region.
3. The insulated gate semiconductor device according to claim 1, wherein the thickness of the insulating film in the trench which comes into contact with the second-conduction-type floating region is thicker than the thickness of a gate insulating film in the trench which comes into contact with the second-conduction-type base region.
4. The insulated gate semiconductor device according to claim 1, wherein the insulated gate semiconductor device is a trench gate IGBT.
5. A method for manufacturing an insulated gate semiconductor device which includes a first-conduction-type drift layer that is a semiconductor substrate, a second-conduction-type base region that is selectively formed on one main surface of the first-conduction-type drift layer, a second-conduction-type contact region provided in a surface of the second-conduction-type base region to improve an ohmic contact with an emitter electrode, a first-conduction-type emitter region that is selectively formed in a surface of the second-conduction-type base region, a second-conduc- tion-type semiconductor layer that is formed on the other main surface of the first-conduction-type drift layer, a plurality of trenches that have a depth greater than that of the second-conduction-type base region from the surface of the first-conduction-type emitter region and have a parallel-stripe-shaped planar pattern along a longitudinal direction of the first-conduction-type emitter region, and a gate electrode that is filled in each of the plurality of trenches with an insulating film interposed therebetween and in which a plurality of surface regions interposed between the plurality of trenches include a second-conduction-type floating region, the second-conduction-type base region, and the first-conduction-type emitter region, the second-conduction-type floating region is electrically insulated from the emitter electrode, the second-conduction-type floating region is alternately arranged with the second-conduction-type base region and the first-conduction-type emitter region, the second-conduction-type base region and the first-conduction-type emitter region come into conductive contact with the emitter electrode, and the second-conduction-type floating region is deeper than the trench and has a lower impurity concentration than the second-conduction-type base region, the method comprising:

forming the second-conduction-type floating region at the same time as a guard ring which is provided in a breakdown voltage structure region surrounding the outermost circumference of the second-conduction-type floating region in order to relax an electric field is formed.

6. A method for manufacturing an insulated gate semiconductor device which includes a first-conduction-type drift layer that is a semiconductor substrate, a second-conduction-type base region that is selectively formed on one main surface of the first-conduction-type drift layer, a second-conduction-type contact region provided in a surface of the second-conduction-type base region to improve an ohmic contact with an emitter electrode, a first-conduction-type emitter region that is selectively formed in a surface of the second-conduction-type base region, a second-conduction-type semiconductor layer that is formed on the other main surface of the first-conduction-type drift layer, a plurality of trenches that have a depth greater than that of the second-conduction-type base region from the surface of the first-conduction-type emitter region and have a parallel-stripe-shaped planar pattern along a longitudinal direction of the first-conduction-type emitter region, and a gate electrode that is filled in each of the plurality of trenches with an insulating film interposed therebetween and in which a plurality of surface regions interposed between the plurality of trenches include a second-conduction-type floating region, the second-conduction-type base region, and the first-conduction-type emitter region, the second-conduction-type floating region is electrically insulated from the emitter electrode, the second-conduction-type floating region is alternately arranged with the second-conduction-type base region and the first-conduction-type emitter region, the second-conduction-type base region and the first-conduction-type emitter region come into conductive contact with the emitter electrode, and the second-conduction-type floating region is deeper than the trench and has a lower impurity concentration than the second-conduction-type base region, the method comprising:

forming the second-conduction-type floating region at the same time as a second-conduction-type RESURF region which is provided in a breakdown voltage structure region surrounding the outermost circumference of the second-conduction-type floating region in order to relax an electric field is formed.

7. The insulated gate semiconductor device according to claim 2, wherein the insulated gate semiconductor device is a trench gate IGBT.

8. The insulated gate semiconductor device according to claim 3, wherein the insulated gate semiconductor device is a trench gate IGBT.

9. The insulated gate semiconductor device according to claim 1, further comprising:

a field stop region that is provided in a portion of the second-conduction-type floating region which comes into contact with the trench and has a higher impurity concentration than the second-conduction-type floating region.

10. The insulated gate semiconductor device according to claim 9, wherein the insulated gate semiconductor device is a trench gate IGBT.

11. The insulated gate semiconductor device according to claim 1, wherein the impurity concentration of the second-conduction-type floating region is in a range of $2\times10^{12}$ cm$^{-2}$ to $1\times10^{13}$ cm$^{-2}$.

12. The insulated gate semiconductor device according to claim 1, wherein the impurity concentration of the second-conduction-type base region is in a range of is $1\times10^{13}$ cm$^{-2}$ to $1\times10^{14}$ cm$^{-2}$.

13. The insulated gate semiconductor device according to claim 1, wherein the impurity concentration of the second-conduction-type floating region is in a range of $2\times10^{12}$ cm$^{-2}$ to $1\times10^{13}$ cm$^{-2}$, and the impurity concentration of the second-conduction-type base region is in a range of is $1\times10^{13}$ cm$^{-2}$ to $1\times10^{14}$ cm$^{-2}$.

14. The insulated gate semiconductor device according to claim 1, wherein the second-conduction-type base region directly contacts the one main surface of the first-conduction-type drift layer.

* * * * *